(12) United States Patent
Goushcha (10) Patent No.: US 10,224,449 B2
(45) Date of Patent: Mar. 5, 2019

(54) PHOTORESISTORS ON SILICON-ON-INSULATOR SUBSTRATE AND PHOTODETECTORS INCORPORATING SAME

(71) Applicant: OSI Optoelectronics, Inc., Hawthorne, CA (US)

(72) Inventor: Alexander O. Goushcha, Aliso Viejo, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 0 days.

(21) Appl. No.: 15/174,112

(22) Filed: Jun. 6, 2016

(65) Prior Publication Data
US 2017/0005219 A1    Jan. 5, 2017

Related U.S. Application Data

(63) Continuation of application No. PCT/US2016/035647, filed on Jun. 3, 2016.

(60) Provisional application No. 62/170,244, filed on Jun. 3, 2015.

(51) Int. Cl.
| H01L 31/09 | (2006.01) |
| H01L 31/0203 | (2014.01) |
| H01L 31/0216 | (2014.01) |
| H01L 31/0224 | (2006.01) |
| H01L 31/028 | (2006.01) |
| H01L 31/0352 | (2006.01) |
| H01L 31/0392 | (2006.01) |
| H01L 31/18 | (2006.01) |

(52) U.S. Cl.
CPC .......... *H01L 31/09* (2013.01); *H01L 31/0203* (2013.01); *H01L 31/028* (2013.01); *H01L 31/0216* (2013.01); *H01L 31/0224* (2013.01); *H01L 31/0352* (2013.01); *H01L 31/03921* (2013.01); *H01L 31/1804* (2013.01)

(58) Field of Classification Search
None
See application file for complete search history.

(56) References Cited

U.S. PATENT DOCUMENTS

| 2,916,678 A | 12/1959 | Bube et al. |
| 3,187,414 A | 6/1965 | Hugle et al. |
| 3,208,022 A | 9/1965 | Sihvonen et al. |
| 3,211,911 A | 10/1965 | Ruhge |

(Continued)

OTHER PUBLICATIONS

International Search Report and Written Opinion dated Sep. 19, 2016 in PCT Application No. PCT/US2016/035647.

(Continued)

*Primary Examiner* — Michelle Mandala
(74) *Attorney, Agent, or Firm* — Novel IP (57) ABSTRACT

A photoresistor comprises a silicon-on-insulator substrate (101) comprising a device layer (4). In an example embodiment and mode at least two non-contiguous first highly conductive regions (2, 3) of semiconductor material are formed on a surface of the device layer, and at least one active region (1) of a high resistivity semiconductor material of a same conductivity type as the first highly conductive regions are formed to propagate through a whole thickness of the device layer and to electrically contact the at least two non-contiguous first highly conductive regions.

28 Claims, 6 Drawing Sheets

(56) References Cited

U.S. PATENT DOCUMENTS

| | | | |
|---|---|---|---|
| 3,436,613 | A | 4/1969 | Gerhard et al. |
| 3,725,660 | A | 4/1973 | Doherty |
| 3,978,509 | A | 8/1976 | Gouin et al. |
| 5,309,132 | A | 5/1994 | Mitchell et al. |
| 6,133,991 | A | 10/2000 | Ake |
| 6,534,808 | B2 | 3/2003 | Nishimura et al. |
| 6,538,299 | B1 | 3/2003 | Kwark et al. |
| 8,912,478 | B2 | 12/2014 | Tio Castro et al. |
| 9,130,104 | B2 | 9/2015 | Liu et al. |
| 2002/0164122 | A1 | 11/2002 | Taylor, Jr. et al. |
| 2003/0122210 | A1 | 7/2003 | Cohen et al. |
| 2008/0124889 | A1* | 5/2008 | Roggenbauer .......... H01L 21/84 438/404 |
| 2010/0273289 | A1 | 10/2010 | Hung et al. |
| 2011/0303829 | A1 | 12/2011 | Castro et al. |

OTHER PUBLICATIONS

International Preliminary Report on Patentability dated Dec. 5, 2017 in PCT Application No. PCT/US2016/035647.
Bessette et al., 'Silicon-on-insulator photoconductors for ultrasonic vibration detection with laser speckle'; Appl. Phys. Lett. 94, 041121 (2009); doi: 10.1063/1.3077159; pp. 041121 1-3; Published by the American Institute of Physics.

* cited by examiner

PHOTORESISTORS ON SILICON-ON-INSULATOR SUBSTRATE AND PHOTODETECTORS INCORPORATING SAME

This application is a continuation of International Application No. PCT/US2016/035647 filed Jun. 3, 2016, which claims benefit of U.S. Provisional Application 62/170,244 filed Jun. 3, 2015, the entire contents of each of which are hereby incorporated by reference.

TECHNICAL FIELD

The technology in this application relates to a semiconductor photoresistors and photodetectors, and in particular, to the structure of a high performance photoresistors and photodetectors.

BACKGROUND

A photoresistor is an electronic component whose resistance is inversely proportional to the intensity of incident light. A photodetector is a device used to detect electromagnetic radiation. Photoresistors have been known for many decades. The following is a non-exhaustive list of US Patents describing one or more aspects of photoresistors (all of which are incorporated herein by reference):

1. U.S. Pat. No. 3,208,022
2. U.S. Pat. No. 6,133,991
3. U.S. Pat. No. 6,534,808
4. U.S. Pat. No. 3,187,414
5. U.S. Pat. No. 3,211,911
6. U.S. Pat. No. 2,916,678
7. U.S. Pat. No. 3,725,660
8. U.S. Pat. No. 5,309,132
9. U.S. Pat. No. 8,912,478
10. U.S. Pat. No. 3,436,613
11. U.S. Pat. No. 3,978,509
12. U.S. Pat. No. 9,130,104

Silicon photoresistors were first built using bulk high resistivity silicon with contacts applied across the bulk body. However, those photoresistors were either rather expensive for mass production or did not show high performance.

With the introduction of photoresistors based on cadmium sulphide (CdS) and cadmium selenide (CdSe), the industry offered the market high performance, low cost devices which are currently widely used in various field of technology. Among the advantages of CdS/CdSe-based photoresistors are wide range of dark resistance, high sensitivity to light, and ease of manufacturing.

More recently, the Restriction of Hazardous Substances (RoHS) also known as Directive 2002/95/EC, was originated in the European Union and restricts the use of six hazardous materials found in electrical and electronic products. Faced with changes in regulation requiring RoHS compliant components, the industry is looking for alternatives which may replace photoresistors that contain prohibited substances like Cadmium. Besides, CdS/CdSe-based photoresistors have several drawbacks. For example, their performance severely deteriorates at high temperatures. In addition, the large performance variance and lag (latency) in response to rapidly changing light conditions limit the use of CdS/CdSe-based photoresistors.

SUMMARY

The technology disclosed herein pertains to a cost effective photoresistor built on a silicon-on-insulator (SOI) substrate. Example embodiments of photoresistors described herein may have similar performances to CdS/CdSe-based devices with respect to dark resistance and light sensitivity, but show far less variation and superior robustness, reliability, and response to rapidly changing light conditions.

The technology disclosed herein also describes photoresistive detectors built on a silicon-on-insulator substrate for detection of radiation within a selective spectral range, which could be used in a variety of industrial applications, including by means of example only, the blue flame and yellow flame detectors.

In addition, the technology disclosed herein describes methods of manufacturing these photoresistors and photodetectors.

In one of its aspects, the technology disclosed herein concerns a photoresistor comprising a silicon-on-insulator substrate comprising a device layer. In an example embodiment and mode, at least two non-contiguous first highly conductive regions of semiconductor material are formed on a surface of the device layer, and at least one active region of a high resistivity semiconductor material of a same conductivity type as the first highly conductive regions is formed to propagate through a whole thickness of the device layer and to electrically contact the at least two non-contiguous first highly conductive regions.

In an example embodiment and mode the device layer has a thickness of less than 10 µm.

In an example embodiment and mode, the silicon-on-insulator substrate comprises: a substrate; an insulator layer formed on the substrate; and the device layer formed on the insulator layer.

In an example embodiment and mode, at least a portion of the at least two first highly conductive regions extends through a thickness of the device layer and touches the insulator layer.

In an example embodiment and mode, the photoresistor further comprises at least two non-contiguous second highly conductive regions of the same conductivity type as the first highly conductive regions formed in the device layer. Each of the second highly conductive regions is adjacent to and in electrical contact with a corresponding one of the first highly conductive regions.

In an example embodiment and mode, the at least two non-contiguous second highly conductive regions extend through the device layer at least partially toward the insulator layer of the substrate.

In an example embodiment and mode, at least a portion of the at least two non-contiguous second highly conductive regions touch the insulator layer of the substrate.

In an example embodiment and mode, the first highly conductive regions are configured to have complementing comb shapes.

In an example embodiment and mode, the photoresistor further comprises a dielectric layer formed on at least part of the active region, with the dielectric layer having a wavelength selection property.

In an example embodiment and mode, the photoresistor is configured with materials to be compliant with Restriction of Hazardous Substances (RoHS) Directive 2002/95/EC.

In another of its aspects the technology disclosed herein concerns a photoresistor comprising a silicon-on-insulator substrate comprising a device layer. At least one active region of high resistivity semiconductor material propagates through a whole thickness of the device layer. At least two non-contiguous regions are formed by removal of semiconductor material on a surface of the device layer. The two non-contiguous regions are filled with a highly conductive material in electrical contact with the active region.

BRIEF DESCRIPTION OF THE DRAWINGS

The foregoing and other objects, features, and advantages of the technology disclosed herein will be apparent from the following more particular description of preferred embodiments as illustrated in the accompanying drawings in which reference characters refer to the same parts throughout the various views. The drawings are not necessarily to scale, emphasis instead being placed upon illustrating the principles of the technology disclosed herein.

DETAILED DESCRIPTION

In the following description, for purposes of explanation and not limitation, specific details are set forth such as particular architectures, interfaces, techniques, etc., in order to provide a thorough understanding of the technology disclosed herein. However, it will be apparent to those skilled in the art that the technology disclosed herein may be practiced in other embodiments that depart from these specific details. That is, those skilled in the art will be able to devise various arrangements which, although not explicitly described or shown herein, embody the principles of the technology disclosed herein and are included within its spirit and scope. In some instances, detailed descriptions of well-known devices, circuits, and methods are omitted so as not to obscure the description of the technology disclosed herein with unnecessary detail. All statements herein reciting principles, aspects, and embodiments of the technology disclosed herein, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Figure 1:
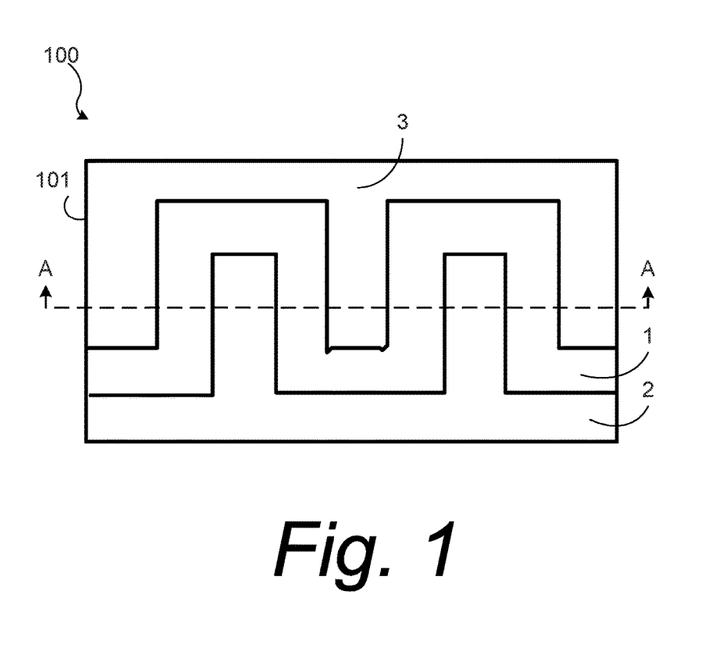
FIG. 1 shows a top view of an example photoresistor built on an SOI substrate in accordance with example embodiments of the technology disclosed herein.

A photoresistor 100 in accord with example embodiments of the technology disclosed herein is built on a silicon-on-insulator (SOI) substrate 101. A top view of the resistor as illustrated in FIG. 1 shows active regions 1 of high resistivity semiconductor interspersed between two not connected electrically, highly conductive (contact) regions 2 and 3. Region 1 can be either n- or p-conductivity type. In FIG. 1, region 1 has a meander-type shape, whereas two contact regions 2 and 3 form interleaving combs.

Figure 2:
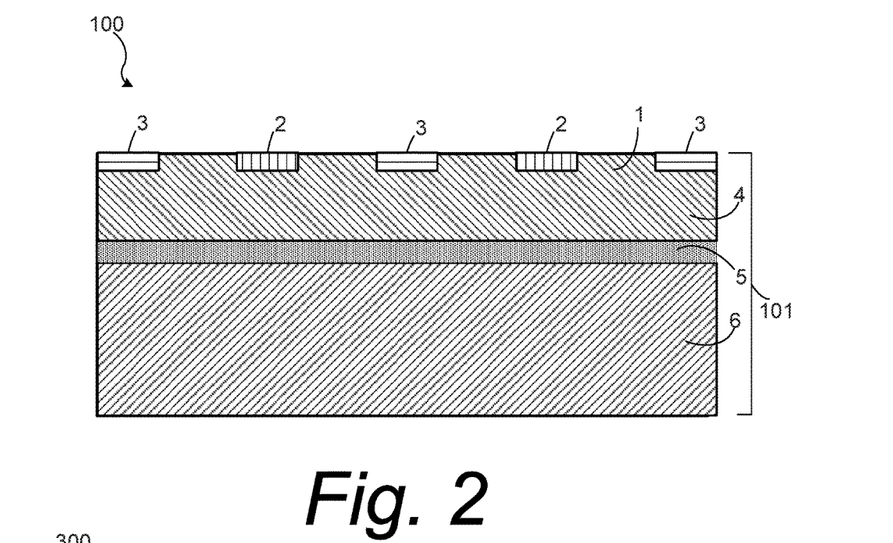
FIG. 2 is the cross section view of FIG. 1 taken along line A-A of the typical photoresistor of FIG. 1.

As seen in FIG. 1 in conjunction with FIG. 2, the photoresistor 100 comprises and is built on a silicon-on-insulator substrate comprising device layer 4. The silicon-on-insulator (SOI) substrate comprises substrate 6 (e.g., a handle substrate, which preferably is a silicon substrate), insulator layer 5 formed on substrate 6; and device layer 4 formed on insulator layer 5. At least two, non-contiguous, first highly conductive regions of semiconductor material, e.g., contact regions 2 and 3, are formed on a surface of the device layer 4. Being non-contiguous, the contact regions 2 and 3 do not touch each other. At least one active region 1 of a high resistivity semiconductor material of a same conductivity type as the first highly conductive regions 2, 3 is formed to propagate through a whole thickness of the device layer 4 and to electrically contact the at least two non-contiguous first highly conductive regions 2, 3. The active region 1 propagates through the whole thickness of the device layer 4, but the active region 1 of the device layer 4 may be of other quality than the rest of the region 4.

One skilled in the art may layout the active region 1 interspersed between two not-electrically connected first highly conductive (contact) regions 2 and 3 using different shapes. In another example embodiment, there may be more than two not-electrically connected, first highly conductive contact regions on a single chip. In still another embodiment, there may be multiple active regions 1 interspersed between the first highly conductive (contact) regions on a single chip. The specific arrangement of the active regions 1 and contact regions 2, 3 controls the resistance and sensitivity of the device.

FIG. 2 shows schematically a cross sectional view of the photoresistor 100 of FIG. 1. The SOI substrate 101 may for example have a top device layer 4 of less than 10 micron thickness. However, one skilled in the art may design a photoresistor using a device layer thickness of greater than 10 microns. The device layer 4 resides on an insulator layer 5. The insulator layer 5 may have a thickness of less than 5 microns (most commonly 1 micron or less). In different applications it may be advantageous to use larger than 5 microns thickness of the insulator layer 5. In some example embodiments, the insulator layer 5 is made of silicon dioxide (SiOx). Underneath the insulator layer 5 is substrate layer 6, which may be for example crystalline silicon of any conductivity type. In other example embodiments, any other material can be used in lieu of silicon as the substrate layer 6.

The device layer 4 in FIG. 2 is a high resistivity semiconductor and can be of either n- or p-conductivity type. In an example embodiment, the device layer 4 may be silicon (Si). In some example embodiments, the device layer 4 comprises a high resistivity semiconductor. As used herein, "high resistivity" means resistivity of 100 Ohm-cm or greater, and preferably 1000 Ohm-cm or greater. In another example embodiment, the device layer 4 in FIG. 2 is the same material as the regions 1 in FIG. 1. In another embodiment, the device layer 4 may include regions of Si with resistivity which is different from that of regions 1, or even may be fabricated from different material.

The highly conductive (contact) regions 2 and 3 of photoresistor may be created in device layer 4 or on the surface of the device layer 4. For example, regions 2 and 3 may be fabricated by heavily doping the selected regions of the device layer 4 through a mask with the dopant of the same conductivity type as the device layer 4. In one example embodiment, the device layer 4 is a highly resistive n-type Si whereas the regions 2 and 3 are heavily doped with n-type dopant. In another example embodiment, the device layer 4 is a highly resistive p-type Si whereas the regions 2 and 3 are heavily doped p-type Si. Regions 2 and 3 may be created using ion implantation, solid source deposition, or other known in the industry method. In some example embodiments, at least portions of regions 2 and 3 may extend to the desired or required depth. This may be achieved by known in the industry techniques, for example by using high-temperature diffusion/drive of dopants.

Figure 3:
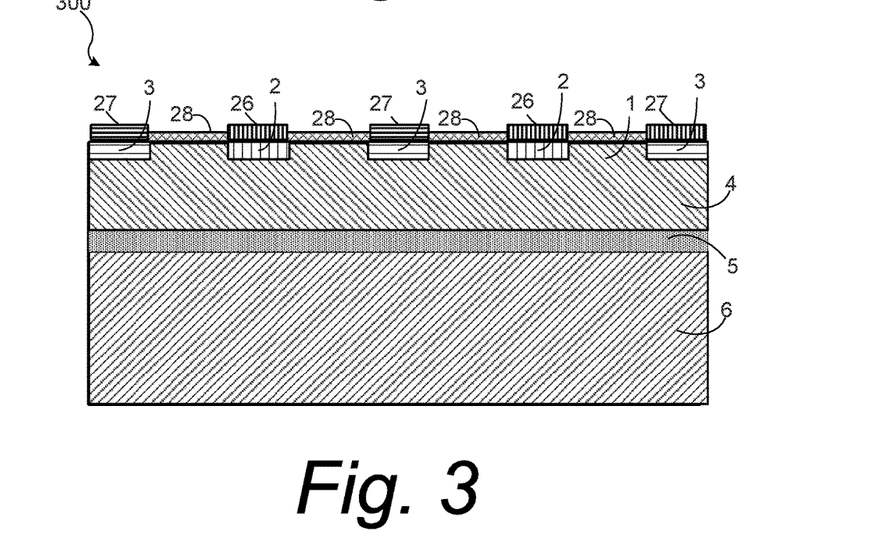
FIG. 3 is a cross sectional view of an example photoresistor having metal contact regions and dielectric layer over the photosensitive areas.

In some example embodiments, at least portions of regions 2 and 3 may be covered with another highly conductive region or material, such as regions 26 and 27, respectively shown in structure 300 of FIG. 3. The regions 26 and 27 form electrical contacts with the regions 2 and 3, respectively. In a specific embodiment, these regions 26 and 27 can comprise metal. In another example embodiment, different highly conductive material can be used in lieu of metal. In still another example embodiment, the regions 26, 27 may be comprised by two or more layers of highly conductive materials, for example a layer of doped poly-silicon in contact with the regions 2, 3 and one or more layers of metal on top of the poly-silicon layer. The regions 26, 27 may be formed using any known in the industry techniques. For example, any type of Chemical Vapor Deposition (CVD), sputtering, or evaporation may be applied to deposit poly-silicon and metal as regions 26, 27.

In some example embodiments, at least portions on the regions 1 may be covered with dielectric material 28. In a certain embodiment, this layer may be comprised of Silicon Oxide (SiOx). In another example embodiment, Silicon Nitride or other dielectric material may be used. In still another example embodiment, a multi-layer structure composed of at least two different films of different dielectric materials can be used.

Figure 4A:
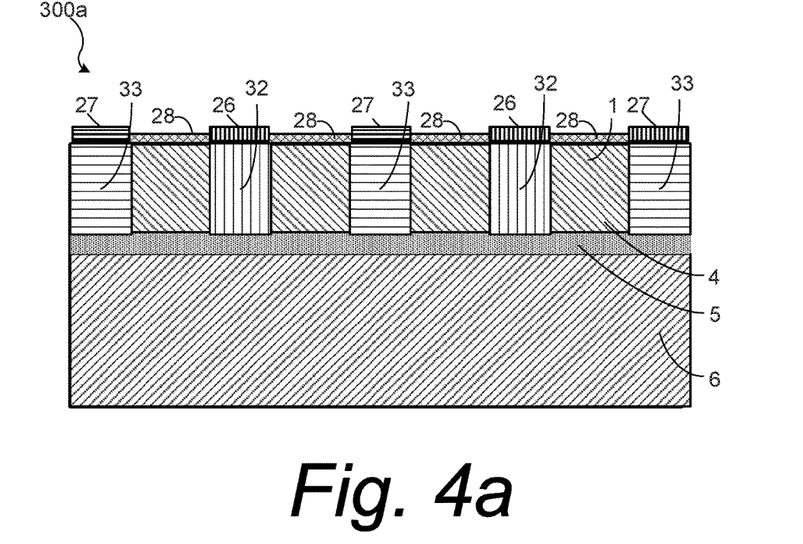
FIG. 4a is a cross sectional view of another example embodiment of a photoresistor built on an SOI substrate, having highly conductive contact regions that penetrate through the whole thickness of the device layer.

FIG. 4a represents an example embodiment of a structure 300a in which the first highly conductive regions 2 and 3 (shown now in FIG. 4a as regions 32 and 33) extend all the way through the thickness of the device layer 4, touching the insulator layer 5. Such feature improves performance parameters of the photoresistor. In some example embodiments, only portions of the regions 2 and 3 may extend through the whole thickness of the device layer 4. As used herein, "touch" describes high-conductivity regions propagating towards the insulator layer but does not involve electrical contact.

Figure 4B:
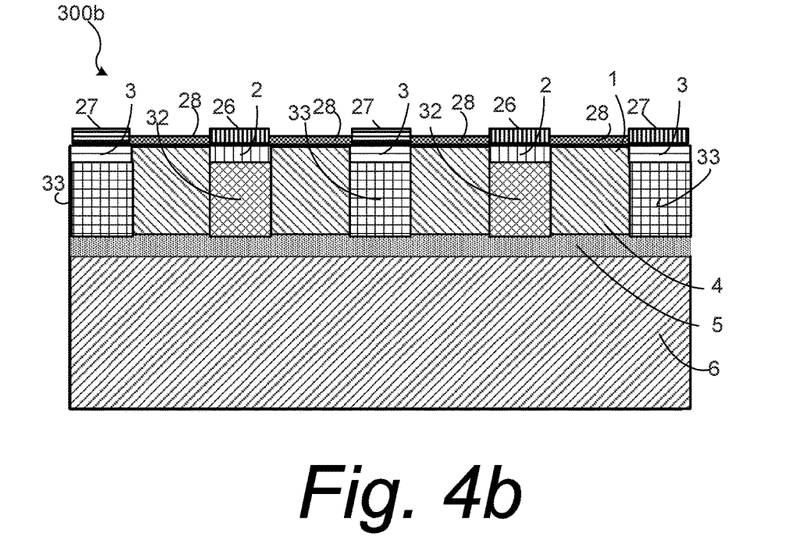
FIG. 4b is a cross sectional view of another embodiment of a photoresistor built on an SOI substrate, having second highly conductive regions underneath the contact regions, penetrating through the whole thickness of the device layer and touching the insulator layer.

In another example embodiment such as that represented by structure 300b of FIG. 4b, the second highly conductive regions 32 and 33 may be made independently of regions 2 and 3 underneath and still in electrical contact with the regions 2 and 3, respectively. The highly conductive regions 32 and 33 are of the same conductivity type as regions 2 and 3, represent second highly conductive regions, and (being underneath regions 2 and 3 in a direction of the thickness of the device layer 4) may be referred to herein as highly conductive sub-regions. In some example embodiments shown in FIG. 4b, regions 32, 33 may extend from the regions 2, 3 all the way to the insulator layer 5 and even touch it.

Thus, as understood from FIG. 4b, for example, a photoresistor according to an example embodiment and mode may comprise at least two, non-contiguous, second highly conductive regions of same conductivity type as the first highly conductive regions formed in the device layer. In an example embodiment, each of the second highly conductive regions is adjacent to (e.g., beneath) and in electrical contact with a corresponding one of the first highly conductive regions.

Figure 4C:
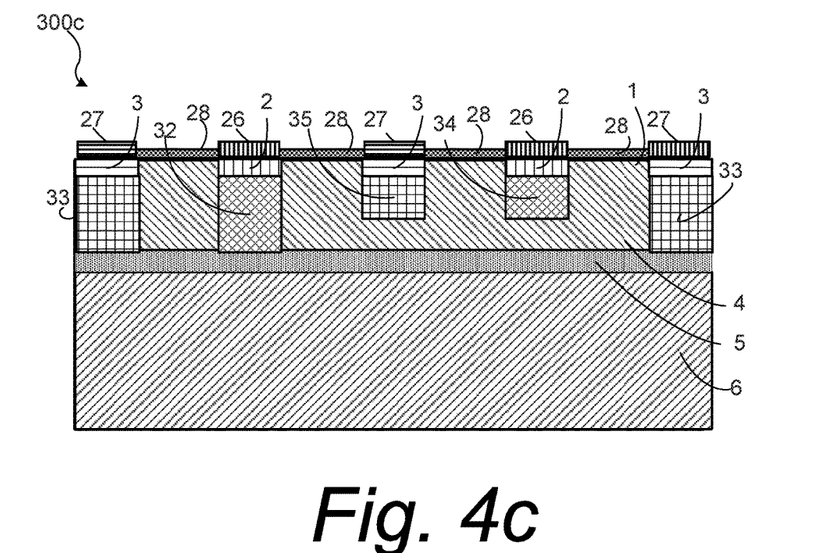
FIG. 4c is a cross sectional view of another example embodiment of a photoresistor built on an SOI substrate, where at least some portions of highly conductive regions do not penetrate through the whole thickness of the device layer and do not touch the insulator layer.

In a further example embodiment such as that represented by structure 300c of FIG. 4c, at least a portion (e.g., at least some) of the regions 32 and 33 (shown now in FIG. 4c as regions 34, 35) may not extend to the bottom of the device layer 4. In an example embodiment, the regions 32, 33, 34, 35 may be heavily doped regions of Si. The dopant type used for the regions 32, 33, 34, 35 (n- or p-) is typically of the same conductivity type as the device layer 4. The doping concentration of the regions 32, 33, 34, 35 may be different from that of the layers 2, 3. The width of the regions 32, 33, 34, 35 may not necessarily be the same as that of the regions 2, 3. Doping of regions 32, 33, 34, 35 can be created using ion implantation, solid source deposition, liquid source deposition, or other known in the industry method. High-temperature drive/diffusion may be applied to push dopants to the desired or required depth within the device layer 4.

Figure 4D:
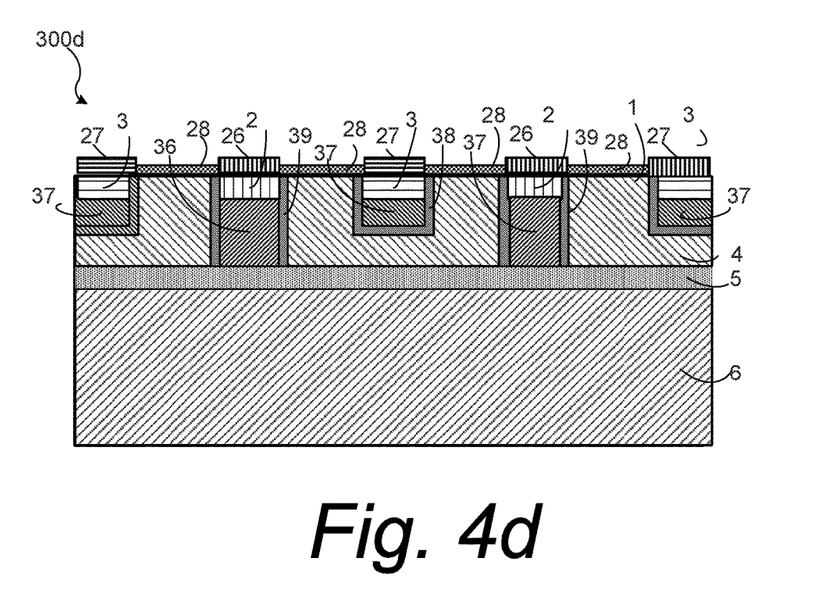
FIG. 4d is the cross sectional view of another example embodiment of a photoresistor built on an SOI substrate, having highly conductive regions formed within the gaps of the removed semiconductor material and surrounded with heavily doped regions of the device layer.

In some example embodiments such as that represented by structure 300d of FIG. 4d, regions 2, 32 and 3, 33 may be prepared by removing semiconductor material and filling the gaps with a highly conductive material as shown with regions 36, 37 in FIG. 4d. In one example embodiment, these highly conductive regions 36, 37 could be doped poly-silicon. In other example embodiment, the gaps may be filled with metal. In still other example embodiment, the regions 36, 37 may be comprised by more than one layer of highly conductive materials. For example, one or more layers of different metal may be applied on top of poly-silicon layer to create regions 36, 37. These regions 36, 37 may be formed by any type of Chemical Vapor Deposition (CVD), sputtering, evaporation, or any other known in the industry techniques.

In specific example embodiments, the gaps of the removed semiconductor material may not be filled with a conductive material to the top of the device layer 4. For example, in some example embodiments the gaps may be partially coated with a film of highly conductive material. In another sample embodiment, more than one film of different highly conductive materials may be used to at least partially coat inside the gaps. In specific example embodiments, the regions 36 may propagate to the insulator layer 5 and touch it. In other example embodiments, the regions 37 may not touch the insulator layer 5.

In specific example embodiments, at least portions of the device layer 4 interfacing with the highly conductive regions 36, 37 may be heavily doped with the same conductivity type dopant as the device layer 4. These heavily doped interface regions are shown as regions 38, 39 in FIG. 4d.

Figure 5:
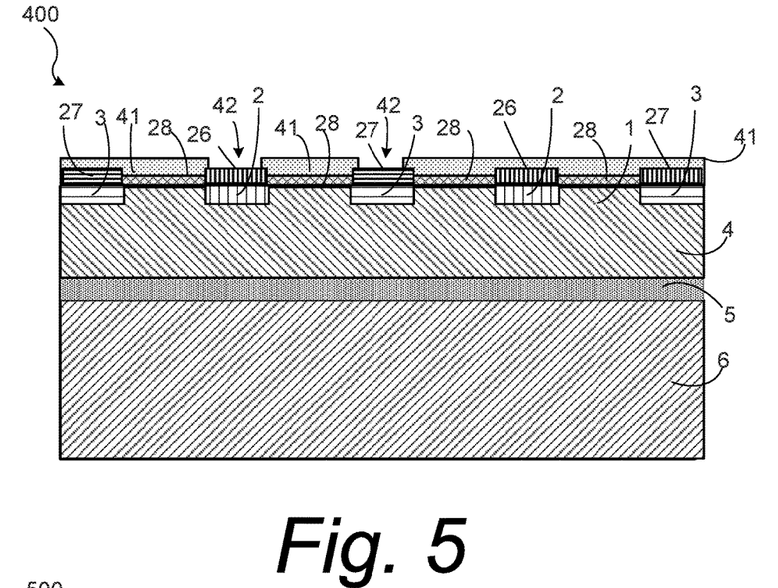
FIG. 5 is a cross sectional view of another example embodiment of a photosensitive element of a photoresistive detector having wavelength-selective dielectric layer on the top of the structure and open contacts to connect to downstream electronics.
Figure 6:
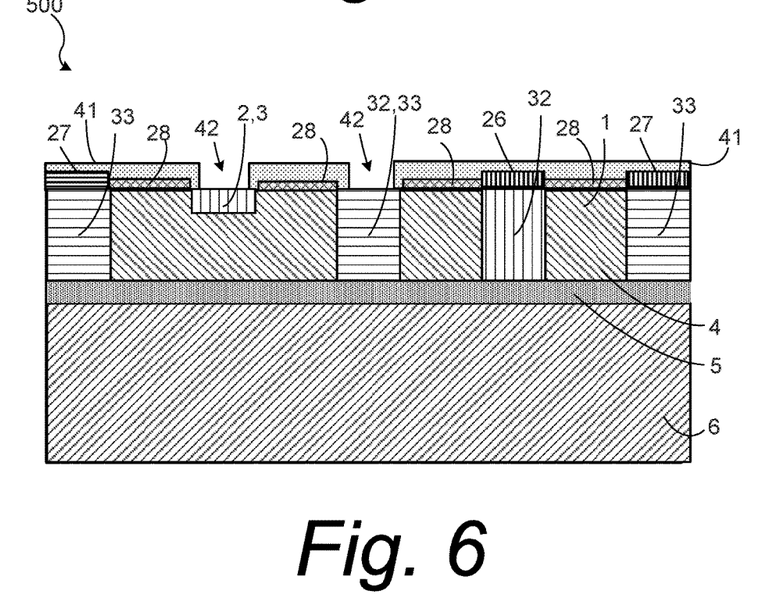
FIG. 6 is a cross sectional view of another example embodiment of a photosensitive element of a photoresistive detector having wavelength-selective dielectric layer on the top of the structure and open contacts to connect to downstream electronics.

In many cases, it is advantageous to coat the devices 100, 300, and 300a-300d with a layer of dielectric 41 (as represented, for example, by structures 400 of FIG. 5 and 500 of FIG. 6). In some example embodiments, this dielectric layer 41 is a protective layer. However, in other example embodiments, this layer 41 may perform a wavelength selection function. In this case, the devices 400 and 500 may have specific industrial application. For example, a blue burner detector may be fabricated by using the layer 41 that transmits light in the blue spectral range only. Alternatively, a yellow burner detector may be fabricated by using the layer 41 that transmits in the yellow spectral range only. One skilled in the art can fabricate similar photoresistive elements with selective sensitivity in any spectral range of the device layer semiconductor sensitivity.

To provide contacts to downstream electronics, portions of the dielectric layer 41 may be removed allowing access (e.g., gaps 42) either to the contact regions 26, 27 in FIG. 5 or to highly conductive regions 2, 3 or 32, 33 in FIG. 6.

Photodetectors may be built using any type of the photoresistive elements described above with the structures 300, 300a-300d, 400, 500, or similar structures in accordance with the above embodiments. In one example embodiment a photodetector 600 shown in FIG. 7 comprises a photoresistive element (such as any photo resistor 300/300a/300b/300d/300d above described) attached to a ceramic substrate 60 using either conductive or non-conductive adhesive layer 61. In other sample embodiments, any type of substrate or header available in the industry and suitable to package photoresistive element may be used in lieu of substrate 60. In some example embodiments, the substrate 60 may incorporate metal through pins 62, connected to the photoresistive elements with wire bonds 63. In other example embodiments metalized through vias with bonding pads may be incorporated in the substrate 60 to allow wire bonding of the photoresistive element on one surface of the substrate 60 and connecting to downstream electronics on the other surface of the substrate 60. In still other embodiments, the electrical connection between the metal or highly conductive regions of a photoresistive element on one side, and bonding pads connected to through vias of the substrate 60 on the other side, may be provided using soldering or other known in the industry method of a normal or flip-chip die attach.

Figure 7:
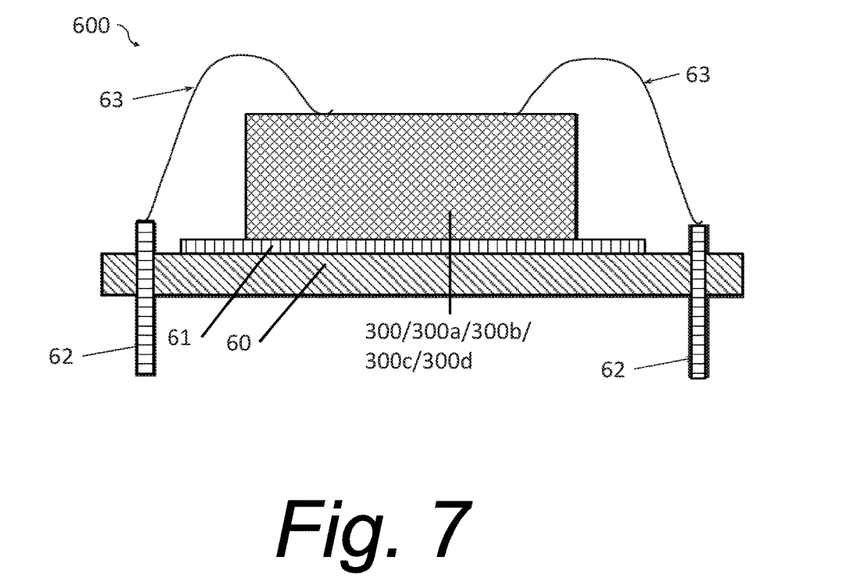
FIG. 7 is a side view of a photodetector which comprises a photoresistor according to example embodiments.
Figure 8:
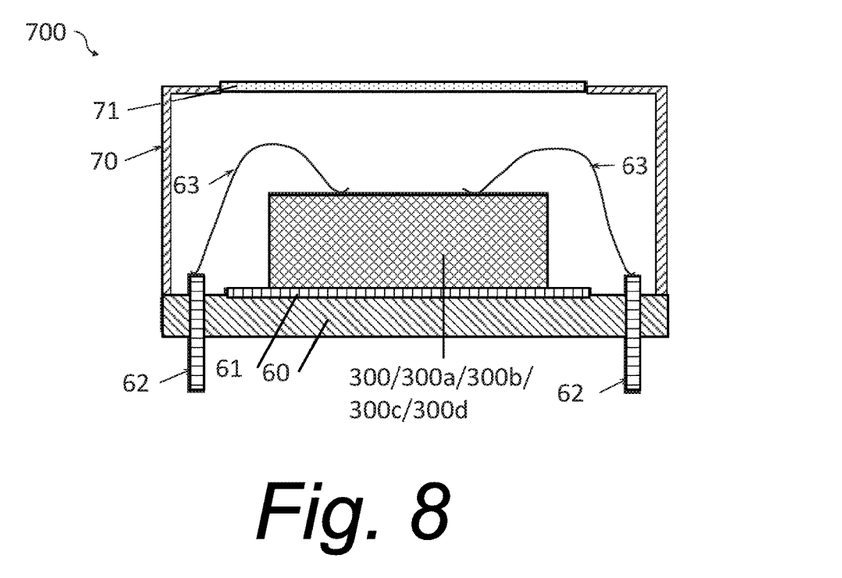
FIG. 8 is a side view, partially sectioned, of a photodetector which comprises a photoresistor and which includes a cap according to example embodiments.

FIG. 8 shows an example photodetector 700, similar to that of FIG. 7, showing a photodetector structure encapsulated with a cap 70 having a light transmitting window 71 (the cap 70 and window 71 shown in cross-section in FIG. 8). In some embodiments the cap 70 may be a metal cap with the window 71 made of glass. In other example embodiment any other material used in the industry could be applied to make a cap 70. In still other example embodiments the light transmitting window 71 may be made using any industry approved material that transmits light in the required spectral range, e.g. quartz for ultraviolet, visible, and near-infrared spectral ranges. In specific embodiments, the encapsulation of photoresistive element may be made using epoxy that covers at least partially the photoresistive element and wires 63. Such type of encapsulation protects device against damaging in a harmful environment. In other embodiments, the encapsulating epoxy may be transparent in a specific spectral range facilitating thereby detection of light within that specific spectral range.

Example objectives of the technology described herein include (but are not limited to):
1) To provide a structure and method of fabrication of a photoresistive element built on a SOI substrate having superior performance parameters and that is RoHS compliant.
2) To provide a structure and method of fabrication of a photodetector for industrial applications based on a photoresistive element built on a SOI substrate that is RoHS compliant.
3) To provide a structure for a SOI-based photoresistor with performance parameters close to CdS/CdSe-based photoresistors and with significantly improved variability, reliability, and response to rapidly changing light conditions and that is RoHS compliant.

Example embodiments depart from conventional technology by building a photoresistive device on a silicon-on-insulator substrate. As mentioned above, known photoresistors made with silicon suffer various limitations. These limitations arose, at least in part, by the fact that the resistance value of silicon is a function of the silicon layer thickness: the thicker the silicon layer, the less the resistance. Known photo resistors were made with thick layers of silicon and thus had poor performance, e.g., insufficient dark resistance. Since photo resistive elements often need high dark resistance, a silicon layer used in a photo resistor should be thin to achieve high resistance. But working with a thin silicon layer, e.g., 25 μm or less, is problematic, from a fabrication standpoint, among others. Moreover, the ready availability and low cost of cadmium sulphide (CdS) and cadmium selenide (CdSe) engendered essentially exclusive reliance on those materials.

Yet the example embodiments described herein provide a relatively thin device layer on a relatively thick substrate. In example embodiments, the thin device layer has a thickness of less than 10 μm. Forming device layer 4 on an insulator facilitates provision of a thin device layer, while the use of the insulation layer 5 and silicon substrate 6 provides greater overall thickness of the SOI substrate and aids handling and manufacturing. In some example embodiments, the thickness of the overall SOI substrate 101 may be greater than 200 μm, for example.

In a typical example embodiment the thickness of the insulation layer 5 may be below 2 μm, preferable 1 μm or less. In other example embodiment the thickness of the insulation layer 5 may be above 2 μm.

Dependently on the design considerations, including a required spectral range and dark resistance, the specific parameters of photodetector incorporating photoresistive element may vary. In an example embodiment a highly sensitive photodetector in the visible spectral range (from 400 nm to 700 nm) may be built using SOI substrate with 10 μm device layer 4 thickness, 1 μm insulation layer 5 thickness, and less than 600 μm substrate (handle) layer 6 thickness. In other example embodiments, the thickness of the device layer 4 may be larger than 10 μm if the extended into near-infrared spectral range is desirable. In still other example embodiments, the device layer thickness may be less than 10 μm if only blue and ultraviolet spectral range is of interest.

Example embodiments include a photodetector having a photoresistor built on an SOI substrate having less than 10 μm thickness of the device Si layer; having at least two electrically isolated, first highly conductive regions on the surface of the device layer; having at least one active region of high resistivity Si that propagate through the whole thickness of the device layer and electrically contacts both first highly conductive regions. Other example embodiments include the same structure built on an SOI substrate having more than 10 thickness of the device later.

Example embodiments include a photodetector having a photoresistor built on an SOI substrate, having at least two electrically isolated, first highly conductive regions on the surface of the device layer with at least portions of these first highly conductive regions propagating through the whole thickness of the device layer; having at least one active region of high resistivity Si that propagates through the whole thickness of the device layer and electrically contacts both first highly conductive regions.

Example embodiments include a photodetector having a photoresistor built on an SOI substrate, having at least two electrically isolated, first highly conductive regions on the surface of the device layer; having at least one active region of high resistivity Si that propagates through the whole thickness of the device layer and electrically contacts both first highly conductive regions, and having a dielectric coating on top of the structure. Other example embodiments include the same structure with an added dielectric coating that transmits light of a selected spectral range on top of the structure.

Example embodiments include a photodetector having a photoresistor built on an SOI substrate, having at least two electrically isolated, first highly conductive regions on the surface of the device layer with at least portion of these two first highly conductive regions propagating through the whole thickness of the device layer; having at least one active region of high resistivity Si that propagates through the whole thickness of the device layer and electrically contacts both highly conductive regions, and having a dielectric coating on top of the structure. Other example embodiments include the same structure as above with added dielectric coating on top of the structure and/or dielectric coating that transmits light of a selected spectral range on top of the structure.

Example embodiments include a photodetector having a photoresistor built on an SOI substrate, having at least two electrically isolated, first highly conductive regions on the surface of the device layer, having also second highly conductive regions interfacing at least partially the first highly conductive regions, the second highly conductive regions may propagate to the bottom of the device layer and may touch the insulator layer; having at least one active region of high resistivity Si that propagates through the whole thickness of the device layer and electrically contacts highly conductive regions, and having a dielectric coating on top of the structure. The structure may incorporate also a dielectric coating that transmits light of a selected spectral range on top of the structure.

Example embodiments include photodetectors which comprise any of the photo resistor embodiments described above structure, having electrical contacts to the either the first or second highly conductive regions to connect to the downstream electronics.

Example embodiments include photodetectors which comprise any photoresistor embodiments structure and/or any embodiments described above the structure of a photodetector having photoresistive element, having a cap that protects the device against harmful environment; the cap may have a window that transmits light within a desired or required spectral range. Other embodiments include epoxy encapsulation to protect against harmful environment.

Example embodiments include methods of preparation of photoresistive detectors of the structures described above.

Although the description above contains many specificities, these should not be construed as limiting the scope of the technology disclosed herein but as merely providing illustrations of some of the presently preferred embodiments of the technology disclosed herein. Thus the scope of the technology disclosed herein should be determined by the appended claims and their legal equivalents. Therefore, it will be appreciated that the scope of the technology disclosed herein fully encompasses other embodiments which may become obvious to those skilled in the art, and that the scope of the technology disclosed herein is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the technology disclosed herein, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A photoresistor comprising:
   a silicon-on-insulator substrate comprising a device layer;
   at least two non-contiguous first conductive regions of a semiconductor material formed on a surface of the device layer;
   at least one active region of a high resistivity semiconductor material of a same conductivity type as the first conductive regions formed to propagate through a whole thickness of the device layer and to electrically contact the at least two non-contiguous first conductive regions.

2. The photoresistor of claim 1, wherein the device layer has a thickness of less than 10 µm.

3. The photoresistor of claim 1, wherein the silicon-on-insulator substrate comprises:
   a substrate;
   an insulator layer formed on the substrate;
   the device layer formed on the insulator layer.

4. The photoresistor of claim 3, wherein at least a portion of the at least two first conductive regions extends through a thickness of the device layer and touches at least a portion of the insulator layer.

5. The photoresistor of claim 1, further comprising at least two non-contiguous second conductive regions of same conductivity type as the first conductive regions formed in the device layer, each of the second conductive regions being adjacent to and in electrical contact with a corresponding one of the first conductive regions.

6. The photoresistor of claim 5, wherein the at least two non-contiguous second conductive regions extend through the device layer at least partially toward an insulator layer of the substrate.

7. The photoresistor of claim 5, wherein at least a portion of the at least two non-contiguous second conductive regions touch at least a portion of an insulator layer of the substrate.

8. The photoresistor of claim 1, wherein the first conductive regions are configured to have complementing comb shapes.

9. The photoresistor of claim 1, further comprising a dielectric layer formed on at least part of the active region, the dielectric layer having a wavelength selection property.

10. The photoresistor of claim 1, wherein the photoresistor is configured to be compliant with Restriction of Hazardous Substances (RoHS) Directive 2002/95/EC with respect to prohibited materials cadmium and cadmium selenide.

11. A photoresistor comprising:
a silicon-on-insulator substrate comprising a device layer;
at least one active region of high resistivity semiconductor material that propagates through a whole thickness of the device layer;
at least two regions formed by removal of semiconductor material on a surface of the device layer, the two regions filled with a conductive material in electrical contact with the active region; and
conductive regions which are of the same conductivity type as the active region, are in electrical contact with the active region, and which interface at least partially the regions with the removed semiconductor material.

12. The photoresistor of claim 11, wherein the device layer has a thickness of less than 10 μm.

13. The photoresistor of claim 11, wherein the silicon-on-insulator substrate comprises:
a substrate;
an insulator layer formed on the substrate;
the device layer formed on the insulator layer.

14. The photoresistor of claim 13, wherein at least a portion of the at least two regions extends through the thickness of the device layer and touches at least a portion of the insulator layer.

15. The photoresistor of claim 11, further comprising a dielectric layer formed on at least part of the active region, the dielectric layer having a wavelength selection property.

16. A photodetector comprising:
a silicon-on-insulator substrate comprising a device layer;
at least two non-contiguous first conductive regions of a semiconductor material formed on a surface of the device layer;
at least one active region of a high resistivity semiconductor material of a same conductivity type as the first conductive regions formed to propagate through a whole thickness of the device layer and to electrically contact the at least two non-contiguous first conductive regions;
metalized regions on top of at least two non-contiguous first conductive regions on the surface of the device layer;
a supporting substrate comprising a supporting substrate first surface and a supporting substrate second surface, with the photoresistive element attached to the supporting substrate first surface and having the metal contacts protruding through the supporting substrate between the supporting substrate first surface and the supporting substrate second surface;
electrical connections between the metalized regions of the photoresistive element and metal contacts protruding through the supporting substrate.

17. The photodetector of claim 16, further comprising a layer of wavelength-selective material at least partially covering the photoresistive element and supporting substrate.

18. A photodetector comprising:
a silicon-on-insulator substrate comprising a device layer;
at least one active region of high resistivity semiconductor material that propagates through a whole thickness of the device layer;
at least two regions formed by removal of semiconductor material on a surface of the device layer, the two regions filled with a conductive material in electrical contact with the active region;
metalized regions on top of at least two non-contiguous first conductive regions on the surface of the device layer;
a supporting substrate comprising a supporting substrate first surface and a supporting substrate second surface, with the photoresistive element attached to the supporting substrate first surface and having the metal contacts protruding through the supporting substrate between the supporting substrate first surface and the supporting substrate second surface;
electrical connections between the metalized regions of the photoresistive element and metal contacts protruding through the supporting substrate.

19. The photodetector of claim 18, further comprising a layer of wavelength-selective material at least partially covering the photoresistive element and supporting substrate.

20. The photoresistor of claim 1, wherein the device layer comprises a high resistivity semiconductor material of the same conductivity type as the highly conductive regions.

21. The photoresistor of claim 1, wherein the device layer comprises a device layer first surface formed on the insulator layer and a device layer top surface opposite the device layer first surface, and wherein the at least two first conductive regions are formed on the device layer top surface.

22. The photoresistor of claim 1, wherein use of cadmium and cadmium selenide is prohibited.

23. The photoresistor of claim 1, wherein all regions of the device layer comprise a semiconductor material having the same conductivity type.

24. The photoresistor of claim 1, wherein the at least one active region is formed on and extends in a same direction from a same surface of the device layer as the at least two non-contiguous conductive regions.

25. The photoresistor of claim 1, wherein resistivity of the at least one active region is greater than the resistivity of the at least two non-contiguous first conductive regions.

26. The photoresistor of claim 11, wherein resistivity of the at least one active region is greater than the resistivity of the two regions filled with the conductive material.

27. The photodetector of claim 16, wherein resistivity of the at least one active region is greater than the resistivity of the at least two non-contiguous first conductive regions.

28. The photodetector of claim 18, wherein resistivity of the at least one active region is greater than the resistivity of the at least two non-contiguous first conductive regions.

* * * * *